United States Patent
Yoon et al.

(10) Patent No.: US 7,149,389 B2
(45) Date of Patent: Dec. 12, 2006

(54) OPTICAL PRINTED CIRCUIT BOARD SYSTEM HAVING TAPERED WAVEGUIDE

(75) Inventors: Keun Byoung Yoon, Daejeon (KR); In Kui Cho, Daejeon (KR); Seung Ho Ahn, Daejeon (KR); Myung Yung Jeong, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 100 days.

(21) Appl. No.: 10/883,529

(22) Filed: Jun. 30, 2004

(65) Prior Publication Data

US 2005/0089276 A1 Apr. 28, 2005

(30) Foreign Application Priority Data

Oct. 27, 2003 (KR) .................... 10-2003-0075222

(51) Int. Cl.
*G02B 6/26* (2006.01)
*G02B 6/42* (2006.01)

(52) U.S. Cl. .................... 385/43; 385/14; 385/15; 385/31; 385/39; 385/50

(58) Field of Classification Search .............. 385/14, 385/15, 31, 43, 39
See application file for complete search history.

(56) References Cited

U.S. PATENT DOCUMENTS 5,125,054 A 6/1992 Ackley et al.

(Continued)

FOREIGN PATENT DOCUMENTS

KR 1020020012945 2/2002

OTHER PUBLICATIONS

Griese, Elmar, "A High-Performance Hybrid Electrical-Optical Interconnection Technology for High-Speed Electronic Systems", IEEE Transactions on Advanced Packaging, vol. 24, No. 3, Aug. 2001.

(Continued)

*Primary Examiner*—Brian Healy
*Assistant Examiner*—Michael P. Mooney
(74) *Attorney, Agent, or Firm*—Blakely Sokoloff Taylor & Zafman

(57) ABSTRACT

An optical printed circuit board system having a tapered optical waveguide is provided. The optical printed circuit board system includes a substrate as a printed circuit board having an electrical circuit and on which an electrical circuit chip is mounted, a system board including an optical bench coupled to the substrate and on which a photoelectrical signal chip electrically connected to the electrical circuit chip through the electrical circuit, an optical device electrically connected to the photoelectrical signal chip, and a first optical waveguide aligned to the optical device for optical coupling and tapered to have a smaller aperture in an output node for outputting the optical signals smaller than that in an input node for inputting the optical signals are mounted, and a back plane including a groove into which the system board is inserted and a second optical waveguide optically coupled to the first optical waveguide and tapered to have a smaller aperture in the output node than in the input node. The input node of the first optical waveguide is optically coupled to the output node of the second optical waveguide or the output node of the first optical waveguide is optically coupled to the input node of the second optical waveguide.

13 Claims, 10 Drawing Sheets

U.S. PATENT DOCUMENTS

| | | |
|---|---|---|
| 6,152,610 A | 11/2000 | Hattori |
| 6,236,788 B1 | 5/2001 | Moisel |
| 6,270,262 B1 | 8/2001 | Hudgins et al. |
| 6,285,808 B1 | 9/2001 | Mehlhorn et al. |
| 6,324,328 B1 | 11/2001 | Mehlhorn et al. |
| 6,343,171 B1 * | 1/2002 | Yoshimura et al. ........... 385/50 |
| 6,804,423 B1 * | 10/2004 | Tsukamoto et al. ........... 385/14 |

OTHER PUBLICATIONS

M. Rode, et al., "Novel Optical Backplane Board-to-Board Interconnection", ECOC 97, Sep. 22-25, 1997, Conference Publication No. 448, IEE, 1997.

* cited by examiner

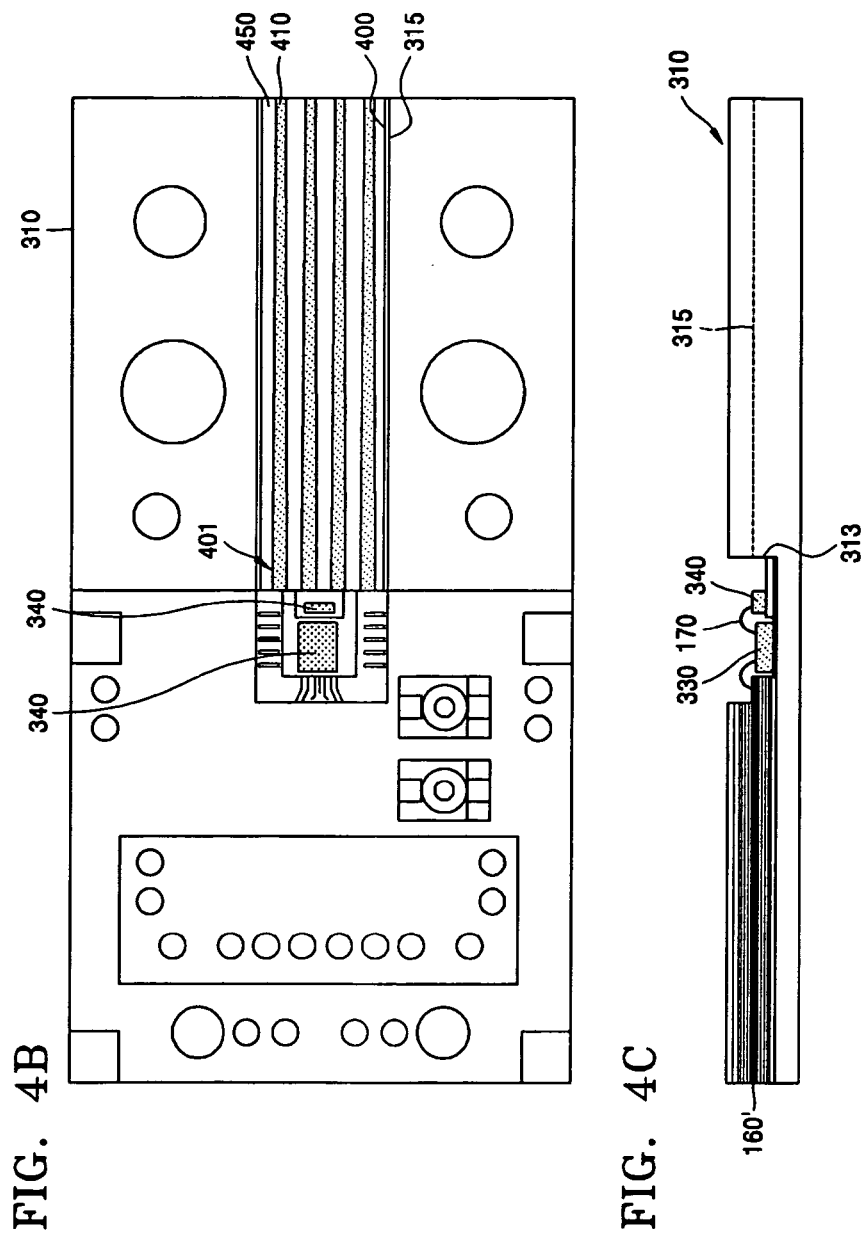

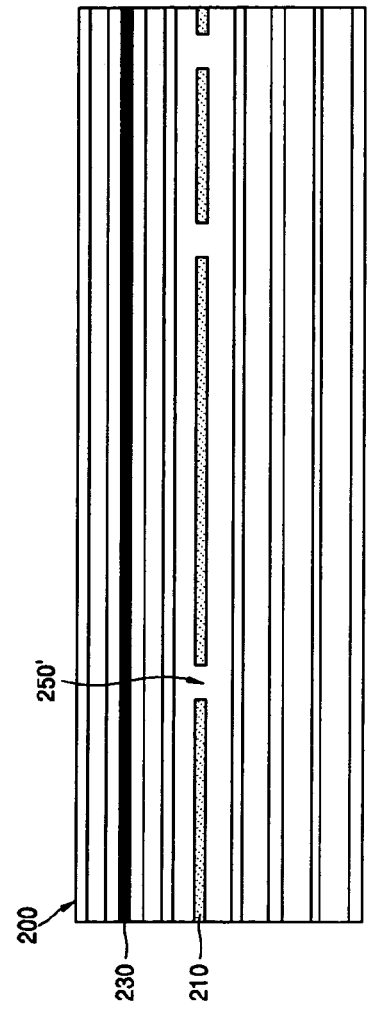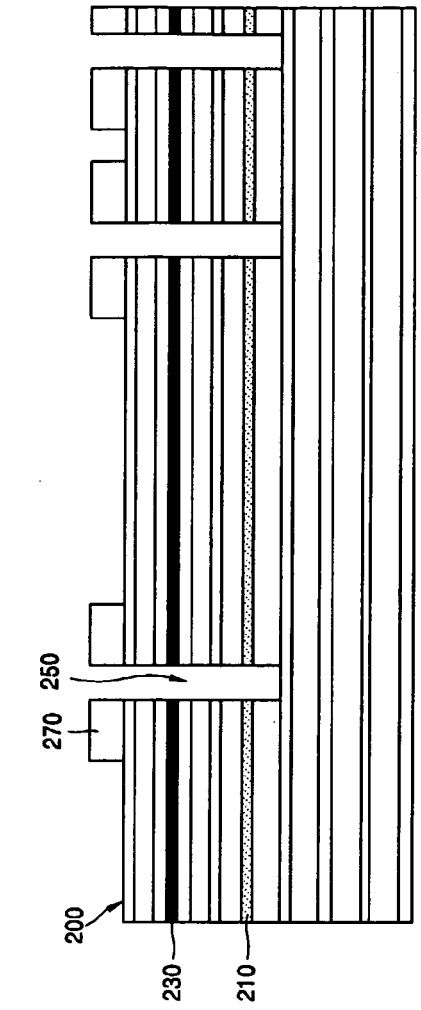
FIG. 5B
FIG. 5C

OPTICAL PRINTED CIRCUIT BOARD SYSTEM HAVING TAPERED WAVEGUIDE

1. Field of the Invention

This application claims the priority of Korean Patent Application No. 2003-75222, filed on Oct. 27, 2003, in the Korean Intellectual Property Office, the disclosure of which is incorporated herein in its entirety by reference.

BACKGROUND OF THE INVENTION

The present invention relates to an optical transmitter/receiver module for transmitting optical signals, and more particularly, to an optical printed circuit board system including an optical printed circuit board with tapered optical waveguides and having improved coupling efficiency of optical signals when connecting the tapered optical waveguides to one another.

2. Description of the Related Art

With the advance of integrated circuit technology, the speed and the degree of integration of integrated circuits have greatly improved. Accordingly, high-performance microprocessors and large capacity memory chips are becoming a reality very fast. In this regard, it is required to increase the speed of signal transmission and the volume of signals transmitted between devices or between system boards on which the devices are mounted and form a specified circuit.

Until now, electrical signals have been used to transmit data to a short distance, between boards within a system for signal transmission or between chips within a board. However, when, for example, next generation information technology systems including large capacity parallel computers and more than terabits level ATM switching systems are introduced, thereby increasing the need for a faster and a large volume of data transmission, the performance of circuit systems will have to be improved accordingly. In addition, the speed of signals and the density of signal wirings must be enhanced.

However, in electrical signal wirings, it is hard to further enhance the speed of signals and the intensity of signal wirings, which is aggravated by signal delays in wirings. In particular, electromagnetic interference (EMI) noise accompanies high-speed electrical signals and high-density electrical signal wirings. Hence, a solution to prevent the EMI noise is needed.

As a solution to these problems, PCB concepts using optical lines instead of electrical lines have been introduced. It is expected that optical lines can be applied to signal transmission between systems or between boards included in a system or between chips included in a board.

Conventional optical PCB related technologies are mostly based on a silicon substrate and focused on including a silicon chip for transmitting signals, an optical emitter, an optical substrate, an optical detector, and a silicon chip for receiving signals in the silicon substrate. The conventional optical PCB related technologies include a lens for optical coupling. To transmit optical signals, an optical line is mounted on the surface of an optical back plane, which is a kind of an optical PCB for signal connection between system boards. However, the optical PCB configured in this way is just a modification of an optical transmitter/receiver module and a little different, in terms of technical characteristics.

A representative optical PCB technology is disclosed in U.S. Pat. No. 6,324,328 patented on Nov. 27, 2001. The optical PCB technology in this patent suggests a PCB including an optical waveguide as an optical wiring for signal transmission. However, this optical PCB technology fails to remove an obstacle to realizing optical PCBs, that is, an alignment between optical signals when transmitting optical signals.

NTT Corporation of Japan suggests a prototype using an existing SMT system. In the prototype, a surface-emitting laser and a photodiode are adhered to a hole in the rear of a plastic BGA package, and two polymer micro-lenses are positioned on one optical path, thereby increasing an allowable mounting margin.

The prototype enables optical signals to be transmitted in parallel between IC packages and substantially reduces a cost of mounting. However, the prototype may still have three misalignment problems. In other words, a first misalignment may occur when accumulating optical waveguides in a PCB. A second misalignment may occur when adhering a surface-emitting laser to the rear of a plastic BGA package. Finally, a third misalignment may occur when soldering the plastic BGA to the PCB, which is a second wiring interconnection. Moreover, the surface-emitting laser has a completely closed structure and fails to present ways to spread or cool off heat generated by chips.

To increase the use of optical PCBs or to smoothly release the optical PCBs in the market, a higher production cost of the optical PCBs than that of conventional PCBs and the problem of aligning optical lines must be tackled before everything else. A high production cost is mainly caused by a complicated manufacturing process designed to overcome the misalignment problem. For example, a silicon optical bench adopted for exact alignment accounts for more than 30 percent of the optical PCB production cost. Various ways to solve the problem of arranging optical lines are being tried but optical coupling efficiency remains still low. Therefore, intensive studies are being conducted to seek ways to enhance optical coupling efficiency and provide an optical PCB having a more economical and effective optical connection.

SUMMARY OF THE INVENTION

The present invention provides an optical printed circuit board or a system including the optical printed circuit board, which enhances an optical coupling efficiency and realizes a more economical and effective optical connection.

According to an aspect of the present invention, there is provided an optical printed circuit board system including a substrate as a printed circuit board and an optical waveguide mounted on the substrate as a path for transmitting optical signals and tapered to have a smaller aperture in an output node for outputting the optical signals than that in an input node for inputting the optical signals.

According to another aspect of the present invention, there is provided an optical printed circuit board system including a substrate as a printed circuit board having an electrical circuit and on which an electrical circuit chip is mounted, an optical bench coupled to the substrate and on which a photoelectrical signal chip is electrically connected to the electrical circuit chip through the electrical circuit, an optical device electrically connected to the photoelectrical signal chip, and an optical waveguide aligned to the optical device for optical coupling and tapered to have a smaller aperture in an output node for outputting the optical signals than that in an input node for inputting the optical signals.

According to yet another aspect of the present invention, there is provided an optical printed circuit board system including a substrate as a printed circuit board having an electrical circuit and on which an electrical circuit chip is mounted, a system board including an optical bench coupled to the substrate and on which a photoelectrical signal chip is electrically connected to the electrical circuit chip through the electrical circuit, an optical device electrically connected to the photoelectrical signal chip, a first optical waveguide aligned to the optical device for optical coupling and tapered to have a smaller aperture in an output node for outputting the optical signals smaller than that in an input node for inputting the optical signals are mounted, and a back plane comprising a groove into which the system board is inserted and a second optical waveguide optically coupled to the first optical waveguide and tapered to have a smaller aperture in the output node than in the input node. The input node of the first optical waveguide may be optically coupled to the output node of the second optical waveguide or the output node of the first optical waveguide may be optically coupled to the input node of the second optical waveguide.

The optical bench may include a metal plate including the photoelectrical signal chip, a first trench into which the optical device is inserted, and a second trench on which a first optical waveguide is mounted and inducing the first optical waveguide to be optically coupled to the optical device. The metal plate of the optical bench may be formed as thick as a metal layer included in the electrical circuit of the substrate.

When the optical device is a light emitting device, the photoelectrical chip electrically connected to the light emitting device may be a driver driving the light emitting device. When the optical device is an optical detector device, the photoelectrical signal chip electrically connected to the optical detector device may be a receiver device amplifying electrical signals supplied from the optical detector device and outputting the electrical signals to the electrical circuit.

When the optical device is a light emitting device, the first optical waveguide may be mounted on the optical bench to have the input node aligned to the light emitting device. When the optical device is the optical detector device, the first optical waveguide may be mounted on the optical bench to have the output node aligned to the optical detector device The input node of the first optical waveguide may be aligned to the light emitting device and may include a 45° mirror converting an optical path to couple light emitted perpendicularly from the light emitting device to the first optical waveguide. The input node of the first optical waveguide may be mounted over an aperture of the light emitting device, from which light is emitted, at a distance no greater than 100 µm. The optical waveguide may be a polymer optical waveguide and may include a core layer surrounded by a cladding layer.

The optical waveguide may be tapered at an angle of 0.001° through 5.000°. The back plane may further include a plurality of electrical circuit layers and insulating layers accumulated on the second optical waveguide. The groove of the back plane may further include a prism converting an optical path to optically couple the first optical waveguide to the second optical waveguide.

An optical printed circuit board system according to the present invention is a more economical and effective optical connection.

BRIEF DESCRIPTION OF THE DRAWINGS

The above and other features and advantages of the present invention will become more apparent by describing in detail exemplary embodiments thereof with reference to the attached drawings in which:

FIGS. 4A through 4C are views for explaining an optical bench included in the optical PCB system according to an embodiment of the present invention;

FIG. 5B is a plan view of back plane 200 with non-continuous portion 250";

FIG. 5C is a plan view with interposer 270 around groove 250;

DETAILED DESCRIPTION OF THE INVENTION

Figure 1A:
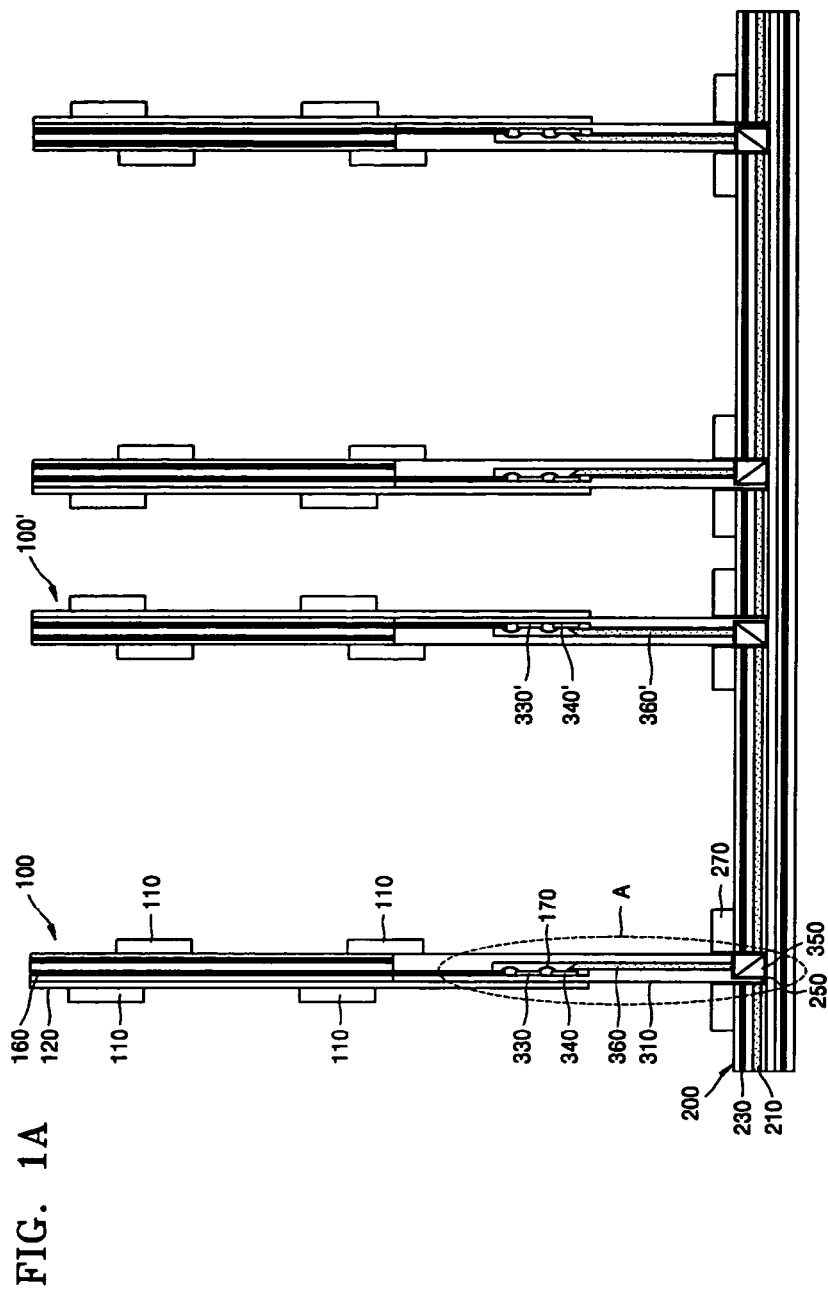
FIG. 1A illustrates an optical printed circuit board (PCB) system according to an embodiment of the present invention.

The present invention will now be described more fully with reference to the accompanying drawings, in which exemplary embodiment of the invention are shown. The invention may, however, be embodied in many different forms and should not be construed as being limited to the embodiments set forth therein; rather, these embodiments are-provided so that this disclosure will be thorough and complete, and will fully convey the concept of the invention to those skilled in the art.

The embodiments of the present invention suggest that tapered optical waveguides for transmitting optical signals be formed or included in a multi-layer printed circuit board (PCB). The optical waveguides are tapered such that the cross sections of input nodes of the optical waveguides for receiving optical signals are larger than those of output nodes of the optical waveguides for transmitting optical signals. The cross section of the input node is formed relatively large to enhance optical coupling efficiency whereas the cross section of the output node is formed relatively small. The diameter of the cross section of the output node may be small enough to fit into an optical receiver.

When optical waveguides serving as optical paths are connected, most of the light output from the cross sections of the output nodes of the optical waveguides may be induced to be effectively incident on the cross sections of the input nodes of the optical waveguides since the cross sections of the output nodes are smaller than the cross sections of the output nodes formed in an opposite direction to the cross sections of the input nodes. Accordingly, an optical coupling efficiency when connecting the optical waveguides may effectively be enhanced.

The present invention suggests that an optical device like a driver/receiver and a light emitter/receiver converting electrical signals into optical signals or optical signals into electrical signals or devices controlling the optical device be mounted on an optical bench being a metal bench. The present invention also suggests that the optical PCB includes the optical bench being a metal bench and a PCB on which electrical devices are mounted. The metal bench may act as a heat spreader.

In the present embodiment, an optical back plane including the optical waveguides has a trench structure to enhance a connection efficiency between boards. As a unit for changing an optical path, a prism is included in the trench. A system board is formed as the optical PCB and inserted into the optical back plane such that light signals are incident on the prism, thereby connecting optical signals between the optical back plane and the system board. This kind of configuration does not require a lens system like a micro lens array, thereby inducing an economical and effective optical connection. Moreover, the problem of alignment that occurs when forming a lens array may be solved.

The optical waveguides in the present embodiment are formed of multi-channels, which are more easily mounted than optic fibres, and of inexpensive polymer material. The optical waveguides formed of polymer material may be tapered by a hot embossing process. Therefore, tapered optical waveguides can be formed at a low cost. The optical PCB system configured according to the embodiment of the present invention may be used when transmitting a large volume of data at tens of bps or several Tbps.

Figure 1B:
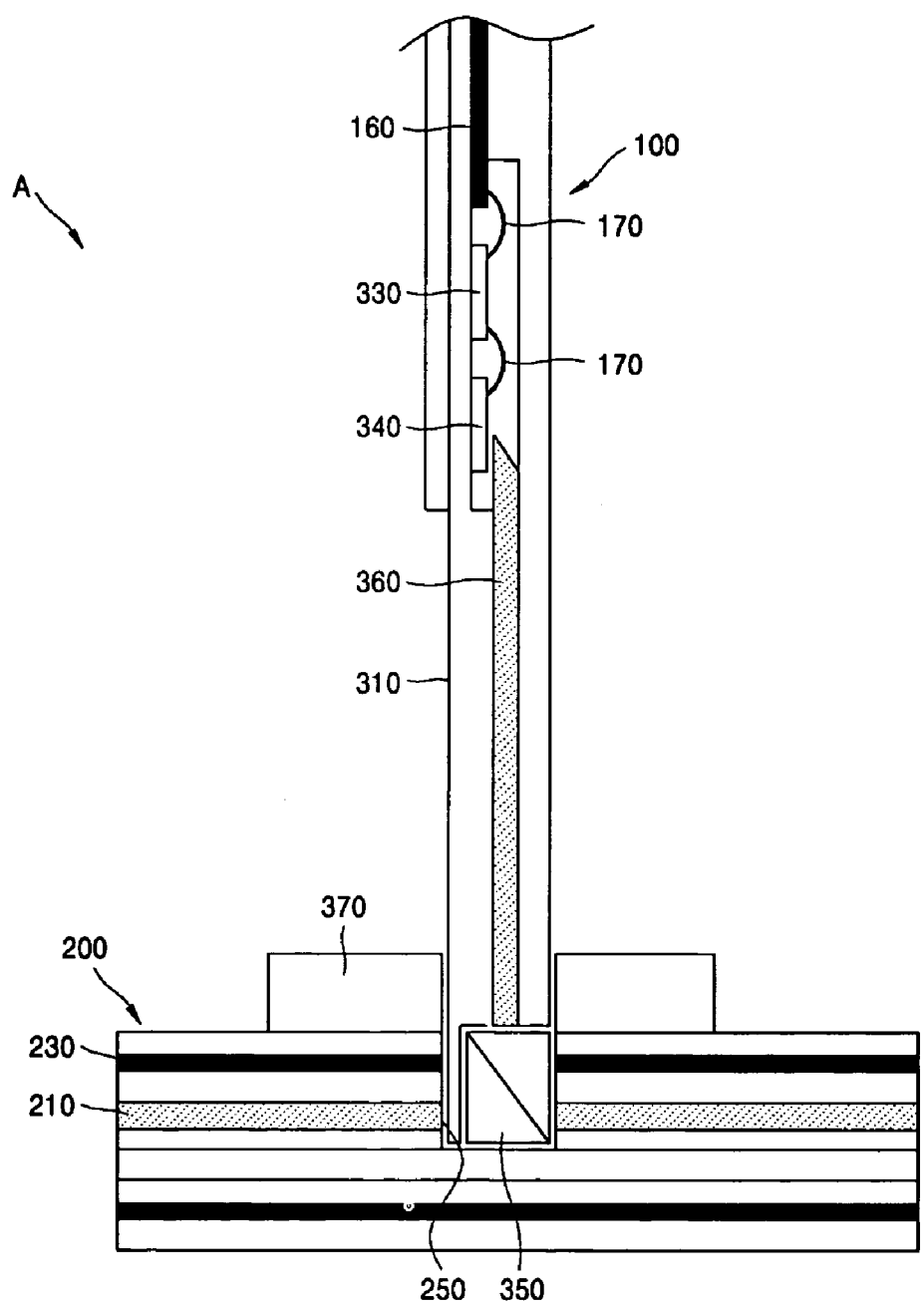
FIG. 1B illustrates an enlarged view of portion A of FIG. 1A to explain the optical PCB system according to the embodiment of the present invention.

FIG. 1A illustrates an optical printed circuit board system according to an embodiment of the present invention. FIG. 1B illustrates an enlarged view of portion A of FIG. 1A to explain the optical printed circuit board system according to the embodiment of the present invention.

Referring to FIGS. 1A and 1B, an optical printed circuit board (optical PCB) system according to an embodiment of the present invention includes a plurality of system boards 100 and a back plane 200 providing a path for signal transmission among the system boards 100. In other words, referring to FIG. 1A, a plurality of system boards 100 may be connected to the back plane 200. The respective system boards 100 and the back plane 200 are formed as an optical PCB.

The system board 100 includes a first electrical circuit wiring 160 and a first optical wiring 360. Electrical circuit chips 110, a photoelectrical signal chip 330 converting electrical signals and optical signals, and an optical device receiving and emitting light to transmit optical signals are mounted on the system board 100. The system board 100 includes a substrate 120 including the first electrical circuit wiring 160 and an optical bench 310 on which the photoelectrical signal chip 330, the optical device 340, and the first optical wiring 360 are mounted. The substrate 120 may be formed of a multi-layer wiring board (MLB) including multiple layers of the first electrical circuit wiring 160. The optical bench 310 mounted on the substrate 120 may be a metal optical bench formed of an aluminium plate or a copper plate.

An electrical circuit is formed of the electrical circuit chips 110 mounted on the substrate 120 and the first electrical circuit wiring 160 included in the substrate 120. Optical signals are transmitted and received by the photoelectrical signal chip 330, the optical device 340, and the first optical wiring 360 mounted on the optical bench 310 that is a metal optical bench.

Referring to FIGS. 1A and 1B, the photoelectrical signal chip 330 and the electrical chips 110 are electrically connected to one another. In other words, the first electrical circuit wiring 160 and a lead 170 connect the photoelectrical signal chip 330 and the electrical circuit chips 110, thereby enabling the transmission of electrical signals between the photoelectrical signal chip 330 and the electrical circuit chips 110.

When the system board 100 is configured to transmit optical signals, the system board 100 includes a laser driver chip as the photoelectrical signal chip 330 to enable the photoelectrical signal chip 330 to act as a transmitter of optical signals. A laser light emitting device like a vertical cavity surface emitting laser (VCSEL) is formed as the optical device 340. Referring to FIG. 1A, when a system board is configured to receive optical signals, the system board 100' includes a photoelectrical signal chip 330' as a receiver of optical signals and an optical device 340' like a photodiode for receiving optical signals. Referring to FIG. 1B, the optical devices 340 and the photoelectrical signal chips 330 may be electrically connected by the lead 170.

The back plane 200 is formed to enable the system boards 100 and 100' to transmit and receive optical signals. Signals that are transmitted between the system boards 100 and 100' via the back plane 200 are optical signals. Therefore, the back plane 200 is formed as an optical PCB and includes a second electrical circuit wiring 230 for forming an electrical circuit and a second optical wiring 210 for transmitting optical signals.

To couple the back plane 200 to the system board 100, the back plane 200 includes a groove 250 into which the system board is inserted. An interposer 270 is formed around the groove 250 to induce the system board 100 to be precisely inserted into the back plane 200.

Referring to FIG. 1A, optical signals are transmitted from the first optical wiring 360 of the system board 100 inserted into the back plane 200 to the second optical wiring 210 of the back plane 200. To couple optical signals transmitted from the first optical wiring 360 to the second optical wiring, that is, to change a transmission path of optical signals, a prism 350 is formed as a unit for changing the transmission path. The prism 350 changes a transmission path of optical signals at a specified angle, for example, a right angle. Therefore, the prism 350 acts as a 45° mirror. To change a transmission path of optical signals, the prism 350 is formed within the groove 250 of the back plane 200. Light containing optical signals transmitted from the first optical wiring 360 is incident on the prism 350. The path of the light is changed, and the light is incident on the second optical wiring 210.

Generally, a lens array is used to align optical signals in case of a typical board-to-board optical coupling. However, it may be difficult to align the optical signals by using the lens array. In the embodiment of the present invention, the prism 350 is used and installed within the groove 250 into which the system board 100 is inserted. Therefore, an optical connection having superior alignment of optical signals may easily be achieved.

When inducing an optical connection between the system board 100 and the back plane 200, optical coupling efficiency between the first optical wiring 360 and the second optical wiring 250 is important. For example, light guided and emitted from the first optical wiring 360 may be lost to a certain degree when the light is incident on an input node of the second optical wiring via the prism 350. To effectively prevent a loss of light, are formed tapered optical waveguides in which optical wirings like the first optical wiring 360 and the second optical wiring 210 are tapered. Considering manufacturing easiness, the optical waveguides may be formed of polymer waveguides.

The input nodes of the first optical wiring 360 and the second optical wiring 210 upon which light is incident may be larger than the output nodes of the first optical wiring 360 and the second optical wiring 210 from which light is emitted. In other words, a relatively large aperture core is formed in an input node of an optical waveguide. A smaller aperture core than that formed in the input node of the optical waveguide is formed in an output node of an optical waveguide to enhance coupling efficiency between optical waveguides. The optical waveguides may be used as the first optical wiring 360 and the second optical wiring 210.

Referring to FIG. 1A, when the optical device 340 is formed as a laser light emitting device, a larger cross section or a larger core may be formed in the input node of the first optical wiring 360 adjacent to the optical device 340 being a laser light emitting device, than that formed in the output node of the first optical wiring 360 aligned by the prism 350. Similarly, a larger cross section or a larger core may be formed in the input node of the second optical wiring 210 adjacent to the prism 350 than that formed in the output node of the second optical wiring 210 positioned in an opposite direction from the input node of the second optical wiring 210. Since the output node of the first optical wiring 360 includes a smaller aperture core than that included in the input node of the second optical wiring 210 aligned by the prism 350, most of the light emitted from the output node of the first optical wiring 360 can be incident on the input node of the second optical wiring 210, thereby significantly enhancing optical coupling efficiency. The first optical wiring 360 and the second optical wiring 210 according to the embodiment of the present invention will later be explained in more detail.

Generally, designing and interconnecting an electrical circuit always accompanies the problem of signal integrity. The optical PCB system needs to be designed and manufactured by taking signal integrity into consideration. In addition, the optical PCB system requires the first optical wiring 360 and the second optical wiring 210 formed as the optical waveguides through which light may be guided after being converted into optical signals. The optical waveguides should be designed and manufactured such that light emitted from a light source can be effectively coupled to the optical waveguides. The optical PCB should easily be applied in the general PCB manufacturing process. It is very important that the optical waveguides and the optical transmitter/receiver are not transformed in the manufacturing process.

FIG. 1A illustrates the optical PCB system configured in such a way that enables optical wiring among the system boards 100 and 100' by reflecting all the perspectives mentioned above. The optical PCB system according to the embodiment of the present invention includes the optical waveguides, through which light can be guided, mounted on a specified region of a conventional PCB. Therefore, areas having problems when electrically connecting high-speed signals may be replaced by the optical waveguides. In other words, the first optical wiring 360 and the second optical wiring 210 are suggested as a way to prevent a bottleneck, a skew, and electromagnetic interference (EMI), which occur when connecting high-speed signals between the system boards 100 and 100', and between chips.

FIG. 1A illustrates the operation of the optical PCB system. To transmit electrical signals generated by the electrical circuit chips 110 of the system board 100 to electrical circuit chips of the system board 100', electrical signals generated by the electrical circuit chips 110 of the same kind are multiplexed. The multiplexed electrical signals are transmitted to the photoelectrical signal chip 330, which is-a VCSEL driver chip, through a transmission line and a via like the first electrical circuit wiring 160 within the substrate 120. The transmitted electrical signals are converted into signals for driving the optical device 340, which is a light emitting device like a VCSEL, in the photoelectrical signal chip 330. The optical device 340 being a VCSEL is operated in response to the driving signals.

In the optical device 340 being a VCSEL, light at a specified radiation angle is irradiated. The light is coupled to the first optical wiring 360 formed as an optical waveguide and having more than 80 percent of optical coupling efficiency, and transmitted through the optical waveguides, which are the first optical wiring 360 and the second optical wiring 210, having an insertion loss of 0.1 dB/cm–0.3 dB/cm.

The optical signals transmitted to a third optical wiring 360' of the system board 100' through the second optical wiring 210 are transmitted to the optical device 340' being a light receiving device like a photodiode and converted into electrical signals. The electrical signals pass through the photoelectrical signal chip 330' formed as an optical receiver. The electrical signals are amplified, demuxed, and finally transmitted to the electrical circuit chips 110'.

Signals may be transmitted between chips within the same system board 100 in a similar way that was described earlier. In other words, optical signals generated by a transmitter may be transmitted to a receiver via an optical wiring, that is, an optical waveguide.

Figure 2A:
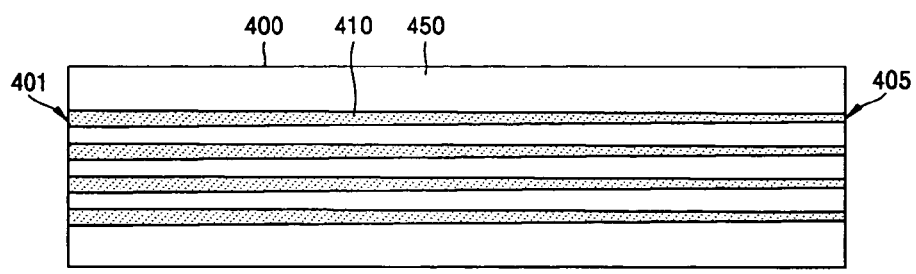
FIGS. 2A and 2B are, respectively, a plan view and a cross-sectional view of an optical waveguide included in the optical PCB system according to the embodiment of the present invention.
Figure 2B:
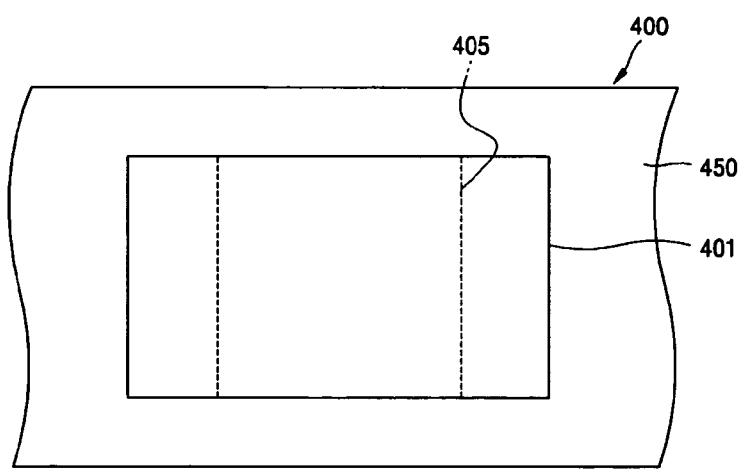

The optical PCB system according to an embodiment of the present invention includes a tapered optical waveguide as an optical wiring. Referring to FIGS. 2A and 2B, the optical waveguide is tapered.

FIGS. 2A and 2B are, respectively, a plan view and a cross-section of an optical waveguide included in the optical PCB system according to the embodiment of the present invention.

Referring to FIGS. 2A and 2B, the optical PCB system according to the embodiment of the present invention includes the first optical wiring 360 and the second optical wiring 210 of FIG. 1A as a tapered optical waveguide 410. The optical waveguide 410 is, in fact, a core layer though which light is guided. The optical waveguide 410 being a core layer is surrounded by a cladding layer 450. An optical waveguide unit 400 includes the optical waveguide 410 and the cladding layer 450. Here, the optical waveguide unit 400 includes a plurality of core layers in the form of multiple channels.

The optical waveguide unit 400 is a polymer optical waveguide. To enhance optical coupling efficiency, a larger aperture core is formed in an input node 401 than that formed in an output node 405. In other words, the optical waveguide unit 400 including tapered core layers is used as the first optical wiring 360 and the second optical wiring 210 of FIG. 1A. The optical waveguide 410, which is a polymer optical waveguide, may be tapered at an angle of 0.001° through 5.000° by taking waveguiding efficiency into account. The optical waveguide 410 is used not only as the first optical wiring 360 in the system board 100, but also as the second optical wiring 210 in the back plane 200 of FIG. 1A.

Referring to FIGS. 2A and 2B, the optical waveguide 410 (a tapered core layer) is formed of polymer material. Therefore, the optical waveguide 410 may be tapered by a hot embossing process.

Figure 3:
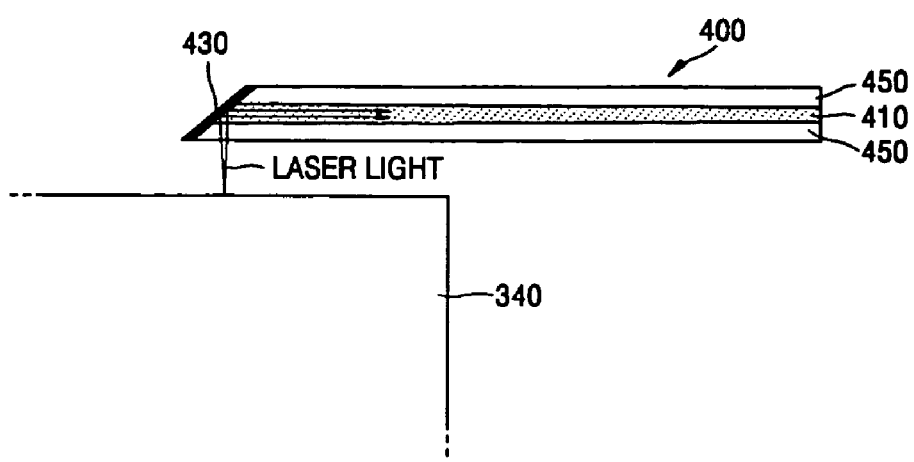
FIG. 3 illustrates an alignment relationship between a light emitting unit and the optical waveguide unit included in the optical PCB system according to an embodiment of the present invention.

Referring to FIG. 3, predetermined alignment relationship is required between the optical waveguide 410 and the optical device 340 (a VCSEL) as well as a light emitting device.

FIG. 3 illustrates an alignment relationship between a light emitting unit and the optical waveguide unit included in the optical PCB system according to the embodiment of the present invention. Referring to FIG. 3, the optical waveguide 410 is aligned to the optical device 340, which is a light emitting device like a VCSEL, to allow laser light emitted from the optical device 340 being a VCSEL to be coupled to the optical waveguide 410. The alignment of the optical waveguide 410 will be explained in more detail with reference to FIGS. 4A through 4C. The optical waveguide 410 may easily be aligned by the optical bench 310 of FIG. 1A.

The optical waveguide 410 is aligned over an aperture to which a laser from the optical device 340 is emitted. A kind of a specular surface 430 is formed in the tip end of the optical waveguide 410. The optical device 340 emits laser light containing optical signals perpendicularly to the specular surface 430. Then, the path of the emitted laser light is changed by the 45° specular surface 430 coated with metal, which is formed in the tip end of the optical waveguide 410. Therefore, more than 80 percent of the emitted laser light can be coupled to the optical waveguide 410 being a core layer. Considering optical coupling efficiency, the distance between the optical waveguide 410 and the aperture of the optical device 340 may be maintained below approximately 200 μm because a long distance may significantly decrease optical coupling efficiency.

Figure 4A:
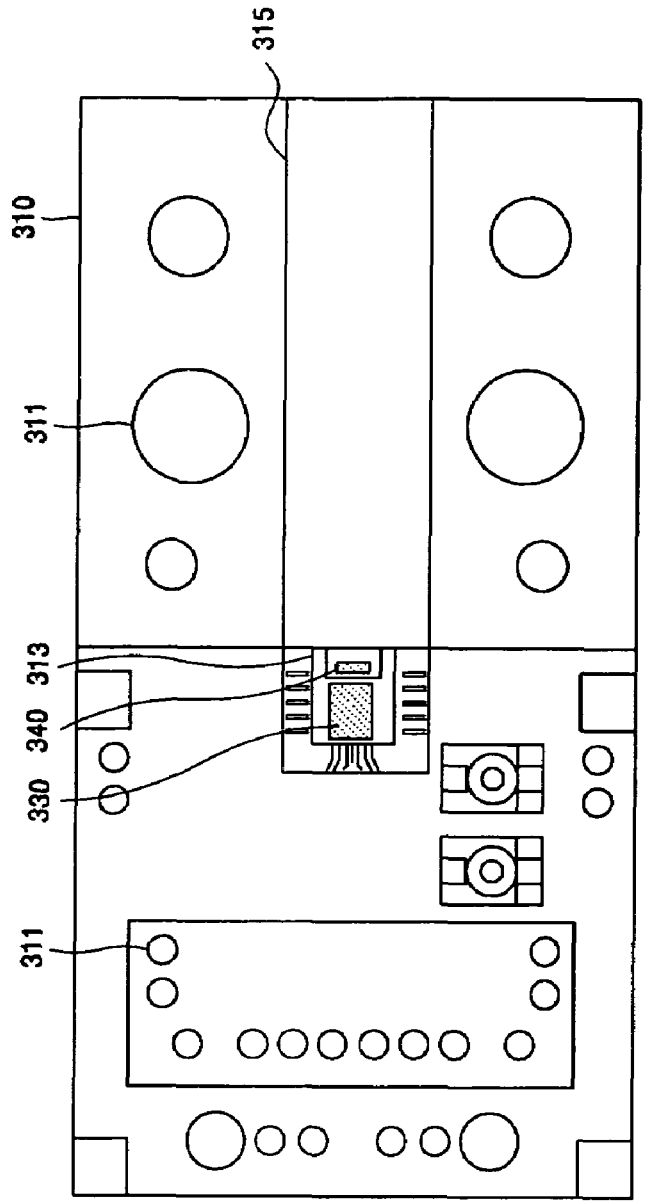

To align the optical waveguide 410 as shown in FIG. 3, in an embodiment of the present invention, it is suggested that the optical bench 310 of FIG. 1A be formed as shown in FIGS. 4A through 4C.

FIGS. 4A through 4C are views for explaining an optical bench included in the optical PCB system according to the embodiment of the present invention. Referring to FIGS. 4A through 4C, and FIGS. 1A and 1B, the system board 100 of FIG. 1A according to the embodiment of the present invention includes the optical device 340 as a light source or a detector, the photoelectrical signal chip 330 as a driver and a receiver, and the first optical wiring 360 as an optical waveguide, which are mounted on the optical bench 310. The concept of the optical bench 310 is used when forming an optical transmitter/receiver in the field of optical PCB technology.

In an embodiment of the present invention, the optical bench 310 is formed of a metal plate. The metal plate may be a copper plate or an aluminium plate employed in conventional PCBs. The metal plate may have a thickness of approximately 1 mm. The optical bench 310 may include various forms of a via 311 formed on the metal plate for electrical connection or coupling between the substrate 120 of FIG. 1A and the optical bench 310. The optical bench 310 may further include the electrical circuit wiring 160' for electrical connection between the photoelectrical signal chip 330 mounted on the optical bench 310 and the electrical circuit chip 110 mounted on the substrate 120.

The metal optical bench 310 according to an embodiment of the present invention includes a first trench 313, which includes the optical device 340 and the photoelectrical signal chip 330, and a second trench 315, which is connected to the first trench 313 and includes the optical waveguide unit 400 of FIG. 2A. The second trench 310 induces the optical waveguide 410 included in the optical waveguide unit 400 to be aligned to the optical device 340, which is a light emitting device or a detector device like a photodiode. By forming the first trench 313 and the second trench 315, the optical waveguide unit 400 can be easily aligned to the optical device 330. In other words, by manually adhering the optical waveguide unit 400 onto the second trench 315 with adhesives, the optical waveguide 410 of the optical waveguide unit 400 can be effectively aligned to the optical device 340.

The optical bench 310 formed of a metal enables heat generated from the optical device 340 or the photoelectrical signal chip 330 to be effectively emitted due to the high thermal conductivity of the metal. In other words, the optical bench 310 formed of the metal may act as a heat spreader.

The optical device 340, the photoelectrical signal chip 330, and the optical waveguide unit 400 for the first optical wiring 360 are mounted on the optical bench 310. Then, the optical bench 310 is coupled to the substrate 120 of FIG. 1A for electrical connection, thereby configuring the system board 100 of FIG. 1A as the optical PCB according to an embodiment of the present invention.

Without a separate process, the optical bench 310 may be implemented by forming the first trench 313 and the second trench 315 on metal layers included in electrical circuits of conventional multiplex PCBs.

Referring to FIGS. 2A and 2B, the tapered optical waveguide 410 may be applied to the second optical wiring 210 embedded in the back plane 200 of FIG. 1A and used as a path for transmitting optical signals.

Figure 5A:
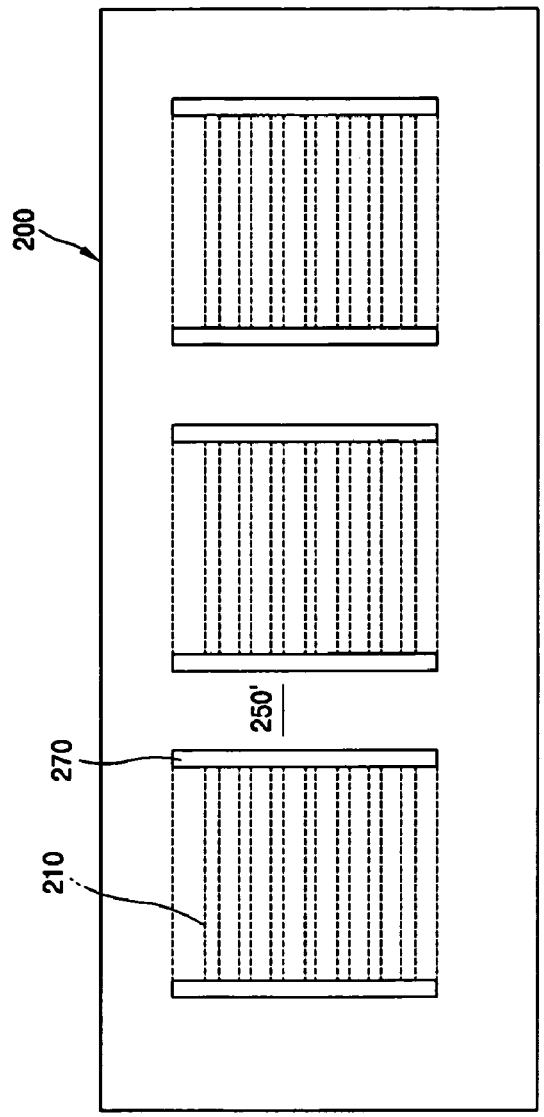
FIG. 5A is a plane view of back plane 200.

Referring to FIGS. 7A through 7C, the back plane 200 includes the groove 250 so that the back plane 200 can be connected to the system board 100 of FIG. 1A. FIGS. 5A through 5C are views for explaining the back plane included in the optical printed circuit board system according to the embodiment of the present invention.

Referring to FIGS. 5A through 5C, FIGS. 1A and 1B, the back plane 200 as an optical PCB according to the embodiment of the present invention may be formed of multiple layers of second electrical circuit wiring 230 interposing insulating layers therebetween. The second optical wiring 210 may be formed under or between the second electrical circuit wiring 230.

As described with reference to FIGS. 2A and 2B, the second optical wiring 210 may be formed of the optical waveguide unit 400 including the optical waveguide 410 being a core layer and the cladding layer 450 surrounding the optical waveguide 410. The optical waveguide 410 is tapered such that the aperture core of the input node 401 is larger than that of the output node 405. Therefore, as explained earlier, the second optical wiring 210 may be formed as a tapered and polymer optical waveguide.

To mount the second optical wiring 210 on a conventional PCB, the second optical wiring 210 is formed in the way that was explained earlier. The second electrical circuit wiring 230 and insulating layers are accumulated by a conventional PCB processing. Then, the back plane 200 including the optical waveguide 210 is formed.

Referring to FIGS. 5A and 5B, the back plane 200 may include a non-continuous portion 250' in the optical waveguide 210 to form the optical waveguide 210 in a non-continuous manner. Referring to FIG. 5C, the non-continuous portion includes the groove 250 and the interposer 270 around the groove 250. As described with reference to FIGS. 1A and 1B, the system board 100 is inserted into the groove 250. The prism 350 is formed as a unit for changing the path of optical signals for optical connection between the first optical wiring 360 of the system board 100 and the second optical wiring 210 of the back plane 200.

The interposer 270 and the groove 250 enable the system board 100 to be precisely and easily inserted into the groove 250. Accordingly, the first optical wiring of the system board 100 and the second optical wiring 210 of the back plane 200 can easily be aligned.

Figure 6:
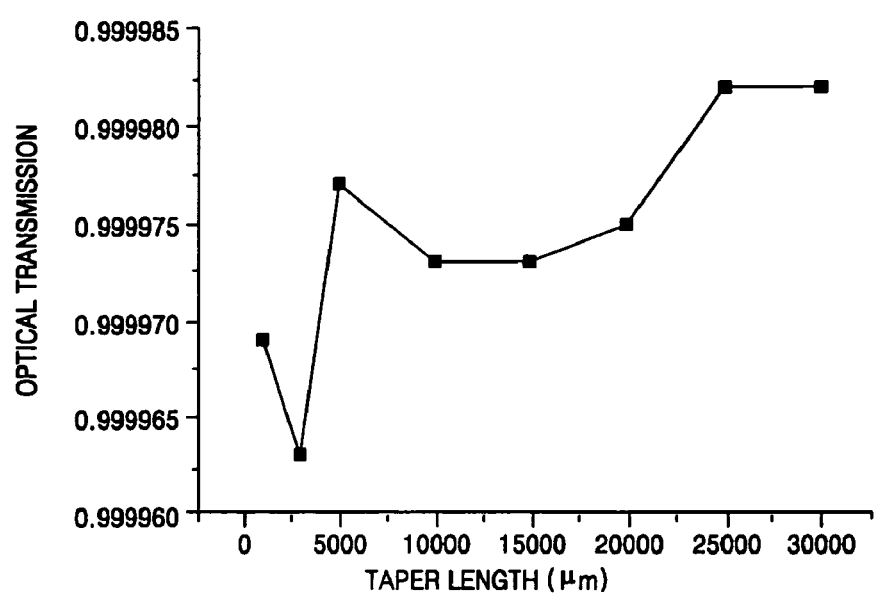
FIG. 6 is a graph illustrating a simulation result to explain optical transmission characteristics in the optical PCB system according to an embodiment of the present invention.
Figure 7:
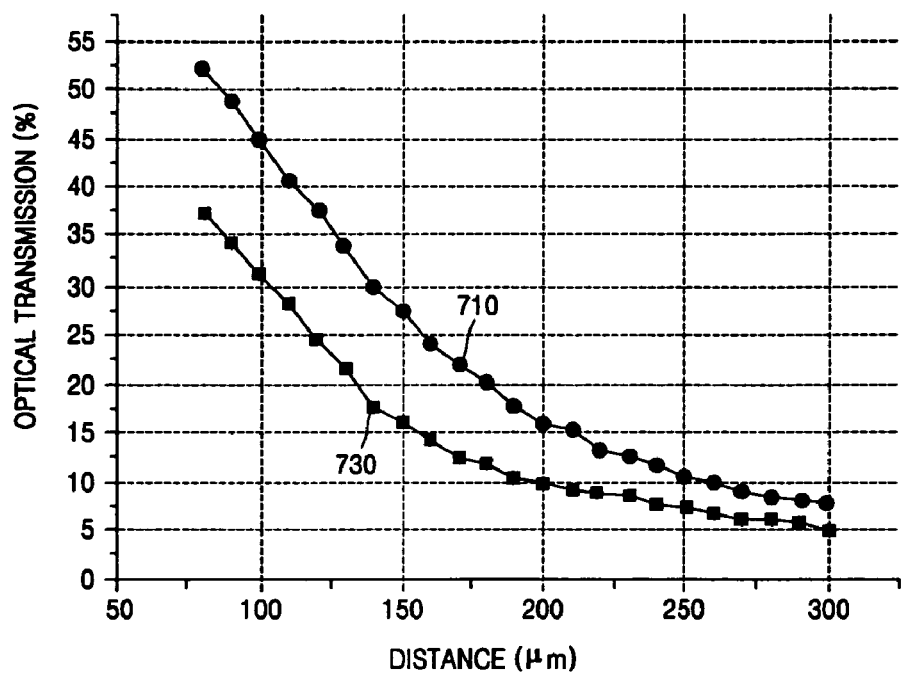
FIG. 7 is a graph showing a simulation result to explain a board-to-board optical transmission in the optical PCB system according to an embodiment of the present invention.

Referring to FIGS. 6 and 7, the first optical wiring 360 and the second optical wiring 210 of FIG. 1A formed as a tapered optical waveguide have high optical transmission. FIG. 6 is a graph showing a simulation result to explain optical transmission characteristics of the optical PCB system according to an embodiment of the present invention.

Referring to FIG. 6, a simulation was conducted by using a ray tracing method to predict propagating loss within the optical waveguide 410 when forming the optical waveguide 410 as the first optical wiring 360 and the second optical wiring 210 according to the embodiment of the present invention. Referring to FIGS. 2A and 2B, the optical waveguide 410 is tapered. The aperture core of the input node 401 is a cross section of a rectangular square with a diameter of 100 μm in width and 60 μm in length. The aperture core of the output node 405 is a section of a regular square with a diameter of 60 μm in width and 60 μm in length. A refractive index variation is set at 1.1%.

FIG. 6 illustrates the optical transmission according to the length of the waveguide, that is, the length of the optical waveguide 410. Referring to FIG. 6, even when the optical waveguide 410 (a core layer) is tapered, if the length of the optical waveguide is more than 1 cm, the optical transmittance is maintained at more than 99.999%. Therefore, even when the optical waveguide 410 is tapered, adverse effects on optical transmittance caused by a change in shape may effectively be prevented.

FIG. 7 is a graph illustrating a simulation result to explain a board-to-board optical transmission in the optical PCB system according to an embodiment of the present invention. Referring to FIG. 7, a simulation was conducted to predict optical transmittance efficiency when optically coupling the first optical wiring 360 and the second optical wiring 210 if the first optical wiring 360 of the system board of FIG. 1A and the second optical wiring 210 of the back pane 200 are formed as the tapered optical waveguide 410 of FIG. 2A. The prism 350 of FIG. 1A is formed as a 45° mirror and as a unit for changing a path in case of optical coupling between the first optical wiring 360 and the second optical wiring 210. By taking the prism 350 into consideration, the optical coupling efficiency was measured as an optical transmittance. Another simulation was conducted to obtain the optical coupling efficiency of a conventional strait-type optical waveguide to compare the optical coupling efficiency of the conventional strait-type optical waveguide with that of the tapered optical waveguide 410.

For a board-to-board coupling, the first optical wiring 360, which is the optical waveguide 410, and the second optical wiring 210, which is also the optical waveguide 410, should be connected to one another at an angle of 90 degrees. To connect the first optical wiring 360 and the second optical wiring 210, the prism 360, which acts as a 45° mirror between the optical waveguides 410, is formed to change an optical path at an angle of 90 degrees. According to the simulation result of FIG. 7, a first graph 710 showing a simulation result when employing the tapered optical waveguide 410 according to an embodiment of the present invention shows a more than 10 percent higher optical transmittance, which is the amount of light reflected by the prism 350 and transmitted to the optical waveguide, compared with a second graph showing a simulation result when employing the strait-type optical waveguide. Hence, it can be seen that the tapered optical waveguide 410 according to the embodiment of the present invention has high optical coupling efficiency.

As described above, an optical PCB system according to the present invention includes a system board including a polymer optical waveguide and a back plane. The optical PCB system may include the optical waveguide transmitting optical signals, a driver/receiver converting electrical signals into optical signals or optical signals into electrical signals, and a light source/detector, which are integrated onto an optical bench. In other words, the metal optical bench is used to adhere the light source/optical detector to a trench, and the optical waveguide is aligned manually on the metal surface to minimize a misalignment between the optical waveguide and the light source/optical detector.

When developing an integrated optical transmitter/receiver module, the optical bench may be formed of metal for optical alignment, thereby reducing a unit price for forming the optical bench. In addition, the optical bench may emit heat generated by chips mounted on the optical bench and act as an electrical ground.

By including the optical waveguide and a prism, the optical transmitter/receiver module does not need a lens required in most of the optical PCBs. Therefore, the optical transmitter/receiver module is advantageous from economic and manufacturing points of view. The tapered optical waveguide may enhance coupling efficiency between the tapered optical waveguide and a laser light source like a VCSEL as well as coupling efficiency between boards.

The constant problem of optical alignment found in conventional optical PCBs may be solved by dividing the optical PCB into an optical part and a general part. For example, by forming an optical bench, the problem of optical alignment can be solved on integrated optical transmitter/receiver module level. In other words, a PCB substrate including an electrical circuit with a driver/receiver is initially packaged to a metal optical bench including a tapered optical waveguide and a light source/detector. Apart from the initial packaging, trenches are formed on a predetermined region of the PCB substrate after the PCB substrate is completely manufactured. The initially packaged optical transmitter/receiver module is inserted/adhered to the PCB substrate. The system board including a via for electrical connection is formed. Therefore, the problem of optical alignment may be prevented when manufacturing PCBs.

As described above, an optical PCB according to the present invention may solve the problems of alignment and high production cost simultaneously, which are the largest obstacle to the commercialisation of optical PCBs.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An optical printed circuit board system comprising:
    a substrate as a printed circuit board having an electrical circuit and on which an electrical circuit chip is mounted;
    a system board comprising an optical bench coupled to the substrate an on which a photoelectrical signal chip electrically connected to the electrical circuit chip through the electrical circuit, an optical device electrically connected to the photoelectrical signal chip, and a first optical waveguide aligned to the optical device for optical coupling and tapered in a first direction parallel to the substrate to have a smaller aperture in an output node for outputting the optical signals smaller than that in an input node for inputting the optical signals are mounted; and a back plane comprising a groove into which the system board is inserted and a second optical waveguide optically coupled to the first optical waveguide and tapered in a second direction parallel to the back plane to have a smaller aperture in the output node than in the input node, wherein the input node of the first optical waveguide is optically coupled to the output node of the second optical waveguide or the output node of the first optical waveguide is optically coupled to the input node of the second optical waveguide.

2. The optical printed circuit board system of claim 1, wherein the optical bench comprises a metal plate comprising the photoelectrical signal chip, a first trench into which the optical device is inserted, and a second trench on which a first optical waveguide is mounted and inducing the first optical waveguide to be optically coupled to the optical device.

3. The optical printed circuit board system of claim 2, wherein the metal plate of the optical bench is formed as thick as a metal layer included in the electrical circuit of the substrate.

4. The optical printed circuit board system of claim 1, wherein the optical device is a light emitting device, and the photoelectrical chip electrically connected to the light emitting device is a driver driving the light emitting device.

5. The optical printed circuit board system of claim 4, wherein the first optical waveguide is mounted on the optical bench to have the input node aligned to the light emitting device when the optical device is the light emitting device.

6. The optical printed circuit board system of claim 1, wherein the optical device is an optical detector device, and the photoelectrical signal chip electronically connected to the optical detector device is a receiver device amplifying electrical signals supplied form the optical detector device and outputting the electrical signals to the electrical circuit.

7. The optical printed circuit board system of claim 6, wherein the first optical waveguide is mounted on the optical bench to have the output node aligned to the optical detector device when the optical device is the optical detector device.

8. The optical printed circuit board system of claim 1, wherein, when the optical device is a light emitting device, the input node of the first optical waveguide is aligned to the light emitting device and comprises a 45° mirror converting an optical path to couple light emitted perpendicularly from the light emitting device to the first optical waveguide.

9. The optical printed circuit board system of claim 8, wherein the input node of the first optical waveguide is mounted over an aperture of the light emitting device, from which light is emitted, with a distance no greater than 100 µm.

10. The optical printed circuit system of claim 1, wherein the optical waveguide is a polymer optical waveguide and comprises a core layer surrounded by a cladding layer.

11. The optical printed circuit board system of claim 1, wherein the optical waveguide is tapered at an angle of 0.001° through 5.000°.

12. The optical printed circuit board system of claim 1, wherein the back plane further comprises a plurality of electrical circuit layers and insulating layers accumulated on the second optical waveguide.

13. The optical printed circuit board system of claim 1, wherein the groove of the back plane further comprises a prism converting an optical path to optically couple the first optical waveguide to the second optical waveguide.

* * * * *